United States Patent
Hammes et al.

(10) Patent No.: US 7,356,324 B2
(45) Date of Patent: Apr. 8, 2008

(54) MOBILE RADIO RECEIVER DEVICE

(75) Inventors: Markus Hammes, Dinslaken (DE); Stefan Van Waasen, Sollentuna (SE)

(73) Assignee: Infineon Technologies AG, Munich (DE)

( * ) Notice: Subject to any disclaimer, the term of this patent is extended or adjusted under 35 U.S.C. 154(b) by 509 days.

(21) Appl. No.: 11/020,747

(22) Filed: Dec. 23, 2004

(65) Prior Publication Data

US 2005/0170805 A1 Aug. 4, 2005

Related U.S. Application Data

(63) Continuation of application No. PCT/DE03/02137, filed on Jun. 26, 2003.

(30) Foreign Application Priority Data

Jun. 27, 2002 (DE) .............................. 102 28 757

(51) Int. Cl.
 *H04B 1/26* (2006.01)
(52) U.S. Cl. ...................... 455/323; 455/314; 455/318; 455/275; 375/324; 375/147
(58) Field of Classification Search ............... 455/324, 455/575.1, 550.1, 425, 424, 456.5, 456.6, 455/561, 452.1, 318, 314, 319, 315, 132, 455/133, 214, 207, 209, 195.1, 196.1, 258, 455/255, 323, 337, 147, 277.1, 273, 303, 455/275, 260, 205, 76, 110, 285; 375/261, 375/219, 322, 316, 317, 298, 136, 147, 324; 370/342, 477, 468, 465, 437; 329/302, 304
See application file for complete search history.

(56) References Cited

U.S. PATENT DOCUMENTS

| 4,682,117 A | * | 7/1987 | Gibson | ........................ 329/302 |
| 5,861,773 A | * | 1/1999 | Meyer | ......................... 329/304 |
| 5,878,089 A | | 3/1999 | Dapper et al. | |

(Continued)

FOREIGN PATENT DOCUMENTS

DE 195 36 526 A1 4/1997

(Continued)

OTHER PUBLICATIONS

"Nachrichtenübertragung", K. E. Kammeyer, B. G. Teubner Stuttgart, 1992, 7 pgs.

(Continued)

*Primary Examiner*—Edward F. Urban
*Assistant Examiner*—Charles Chow
(74) *Attorney, Agent, or Firm*—Eschweiler & Associates, LLC

(57) ABSTRACT

The invention is directed to a receiver arrangement, for example, in a mobile radio, which allows the use of slowly locking phase locked loops for a point-to-point connection between two transceivers, even in the case of a heterodyne receiver structure. The need to change channels between a transmission slot and a reception slot is avoided by virtue of a changeover device being provided for the purpose of interchanging the in-phase and quadrature components at the input side on a down-conversion frequency mixer. This advantageously allows either the upper sideband or the lower sideband of a useful signal to be down-converted without the need to change channel.

17 Claims, 2 Drawing Sheets

U.S. PATENT DOCUMENTS

| | | | |
|---|---|---|---|
| 5,896,562 A * | 4/1999 | Heinonen | 455/76 |
| 6,282,413 B1 * | 8/2001 | Baltus | 455/260 |
| 6,490,326 B1 * | 12/2002 | Bastani et al. | 375/317 |
| 6,717,981 B1 * | 4/2004 | Mohindra | 375/219 |
| 6,731,917 B1 * | 5/2004 | Krishna | 455/205 |
| 6,738,433 B1 * | 5/2004 | Van Waasen et al. | 375/316 |
| 7,031,672 B2 * | 4/2006 | Malone et al. | 455/110 |
| 7,031,686 B2 * | 4/2006 | Kim et al. | 455/285 |
| 2002/0051497 A1 * | 5/2002 | Breems et al. | 375/261 |
| 2002/0118773 A1 * | 8/2002 | Minasi et al. | 375/322 |
| 2003/0060180 A1 * | 3/2003 | Hall et al. | 455/302 |
| 2003/0171101 A1 * | 9/2003 | Suzuki et al. | 455/147 |
| 2004/0218576 A1 * | 11/2004 | Imagawa et al. | 370/342 |
| 2005/0107059 A1 * | 5/2005 | Lehning et al. | 455/303 |

FOREIGN PATENT DOCUMENTS

| | | |
|---|---|---|
| DE | 100 46 586 A1 | 4/2002 |
| JP | 02113608 A | 4/1990 |
| JP | 09247226 A | 9/1997 |
| JP | 11205403 A | 7/1999 |
| JP | 11340860 A | 12/1999 |
| JP | 2002076969 A | 3/2002 |

OTHER PUBLICATIONS

"Datenübertragung", Peter Bocker and Hans Heinrich Voss, Band 1, Grundlagen, 2, Auflage, Springer-Verlag, 1983, 15 pgs.

* cited by examiner

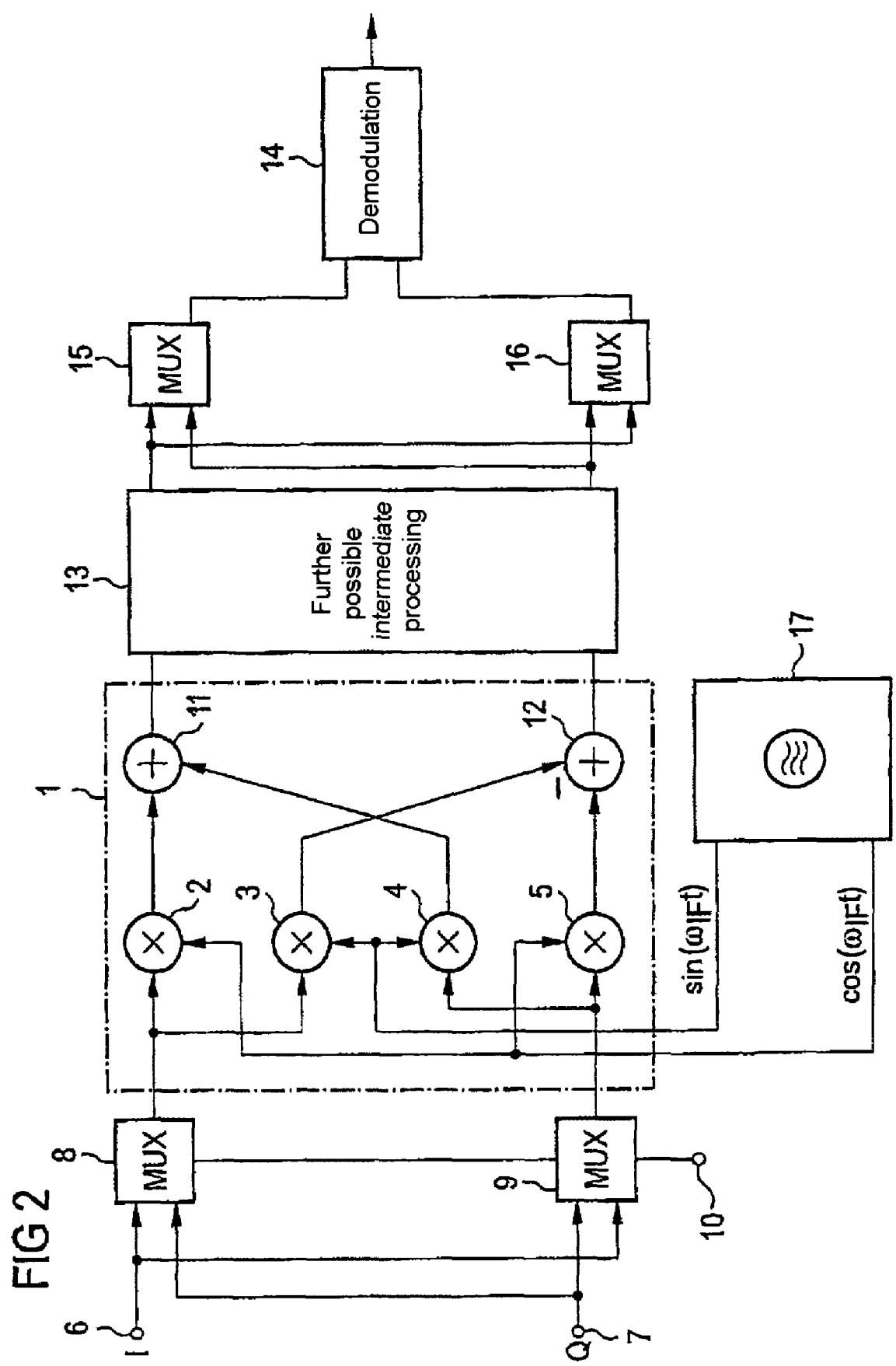

MOBILE RADIO RECEIVER DEVICE

REFERENCE TO RELATED APPLICATIONS

This application is a continuation of PCT/DE03/02137, filed Jun. 26, 2003 which was not published in English, which claims the benefit of the priority date of German Patent Application No. DE 102 28 757.0, filed on Jun. 27, 2002, the contents of which both are herein incorporated by reference in their entireties.

FIELD OF THE INVENTION

The present invention relates to a receiver arrangement, particularly for mobile radio.

BACKGROUND OF THE INVENTION

Normally, modern digital mobile radio systems are exclusively full-duplex systems. Full-duplex systems are distinguished in that it is possible to send and receive data simultaneously. Reference is also made to full-duplex systems in this context when sending and receiving are not performed simultaneously but changeover between the transmission directions takes place without being noticed by the subscriber.

In principle, a distinction is drawn between two duplex methods. In the case of "frequency division duplex" (FDD), sending and receiving are performed in different, dedicated frequency bands. In the case of time division duplex (TDD), on the other hand, the transmission directions are divided into different times or time slots.

In the widely used mobile radio standard GSM (Global System for Mobile Communication), TDD and FDD methods are used in combination in order to be able to provide transceivers which can be manufactured as inexpensively as possible and can be integrated as well as possible.

Particularly in the reception part of modern mobile radio systems, the "low-IF receiver architecture" is increasingly being used instead of the homodyne receiver architecture (direct conversion) on account of the offset problems that arise therein. In the case of the low-IF-receiver architecture, the radio-frequency signal received is first of all down-converted to a relatively low intermediate frequency (IF) and in a second step to baseband.

In transceivers designed in this manner between which there is a point-to-point connection, the problem regularly arises that the intermediate frequency differing from zero means that it is always necessary to change channels between the send and receive time slots. That is to say that the phase locked loop in the transceiver always needs to lock onto a new frequency between send and receive time slots, even when the nominal channel does not actually need to be changed. However, this disadvantageously results in the net data transmission rate achieved using the transmission channel being greatly reduced from the gross data rate.

The document DE 100 46 586 specifies systems for data transmission that solve this problem by setting the reception sideband of the low-IF-receiver, "sideband selection". In this case, for a point-to-point connection, one of the two receivers down-converts a received radio-frequency signal to a complex-value intermediate-frequency signal with a positive intermediate frequency and the other receiver down-converts it to an IQ signal with a negative intermediate frequency. This practice means that the phase locked loop does not need to lock onto a new carrier frequency between every send and receive time slot and that a phase locked loop (PLL) with a slow locking time can therefore advantageously be used.

As an alternative to the use of positive or negative intermediate-frequency levels, a receiver structure with an image-frequency suppressing mixer may also be used in both radio parts of the point-to-point connection.

However, it remains a drawback of such receiver structures that the receivers need to be designed, in terms of the second down-conversion mixing stage, which down-converts from intermediate frequency to baseband, both for a situation in which the channel frequency is below the local oscillator frequency of the second mixing stage and for a situation in which the channel frequency is above the local oscillator frequency of the second mixing stage.

An at least theoretical possibility for solving this problem involves the corresponding analog and digital components being of duplicate design for the two regularly occurring cases described. This naturally means increased additional complexity.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later. The present invention relates to a two-point modulator arrangement that is suitable for controlled oscillators having only one control input and has good noise properties.

The present invention is directed to a receiver arrangement, for example for a mobile radio or station, which is suitable for mobile radio methods with a time division duplex component, that allows the use of phase locked loops with a slow locking time and at the same time can be produced with little complexity.

The invention comprises a receiver arrangement, comprising a down-conversion frequency mixer, designed for multiplying complex-value signals. The mixer includes a first input comprising an in-phase connection and a quadrature connection, with a second input comprising an in-phase connection and a quadrature connection (or first and second phase connections, respectively), and an output comprising an in-phase connection and a quadrature connection. The receiver further comprises a switching device configured to switch the in-phase and quadrature connections on the basis of a control signal, wherein the device is connected to the first or second input of the down-conversion frequency mixer. The device includes an in-phase input and a quadrature input, and also an in-phase output and a quadrature output, with a first switching state, in which the in-phase input is connected to the in-phase output and the quadrature input is connected to the quadrature output, and a second switching state, in which the in-phase input is connected to the quadrature output and the quadrature input is connected to the in-phase output.

The present invention provides for complex-value signal processing of the received useful signal. Depending on whether the useful signal is in the upper or lower reception sideband, the present invention selectively interchanges the in-phase and quadrature components of the complex-value signal. In this case, the interchange can be effected either for the complex-value useful signal itself or for the local oscillator signal which is likewise to be supplied to the mixer.

This option of interchanging the in-phase and quadrature components of the complex-value signal at the mixer input allows the signal to be processed further regardless of whether the upper or the lower sideband was modulated. In line with the present invention, the local oscillator frequency may advantageously remain unchanged between sending and receiving, with it nevertheless being possible to down-convert the channel which is above the local oscillator frequency or the channel which is below the local oscillator frequency, depending on the modulated sideband.

The principle described can also be implemented with little complexity, since only two or four multiplexers need to be additionally provided. The present invention requires no additional components for inverting the subsequent demodulation or for phase-shifting the signals. In addition, the down-conversion frequency mixer does not need to change its direction of rotation.

Depending on whether the local oscillator signal or the useful signal itself is changed over or interchanged in terms of the I and Q signal components, the generated output signal from the down-conversion frequency mixer may also have a phase shift of 90° from the signal which is actually desired and/or an inverse arithmetic sign for the generated signal. This has no disadvantageous effects on the further signal processing in the receiver, however.

In line with one embodiment of the invention, the device for interchanging the in-phase and quadrature connections comprises a first multiplexer and a second multiplexer. The outputs of the two multiplexers are connected to the in-phase and quadrature connections of the first or second inputs of the down-conversion frequency mixer.

Accordingly, the device for interchanging the in-phase and quadrature connections with the two multiplexers interchanges the in-phase and quadrature components either of the useful signal or of the local oscillator signal at the input of the down-conversion frequency mixer.

The two multiplexers, in one example, each have a first and a second input which are connected to one another such that the outputs of the multiplexers provide the complex-value signal split into in-phase and quadrature components either in unchanged form or in a form with interchanged components, depending on a control signal. In this case, the control inputs are preferably connected to one another in order to supply the changeover control signal. The control signal is provided on the basis of whether the down-conversion frequency mixer's useful signal at the input is modulated in terms of its upper or in terms of its lower sideband.

The receiver arrangement, in one example, comprises a heterodyne structure, for example a low-IF receiver structure. In this arrangement, besides the aforementioned down-conversion frequency mixer, which down-converts an intermediate-frequency signal to baseband in this case, a further down-conversion frequency mixer, which converts a radio-frequency signal to a complex-value intermediate-frequency signal, is connected upstream on the input side. The two down-conversion frequency mixers are preferably each supplied with a suitable local oscillator signal that may be generated by a respective phase locked loop, for example. In the case of a heterodyne receiver structure of this type, the device for changing over the in-phase and quadrature connections is accordingly connected either in the complex-value useful-signal path between the two down-conversion frequency mixers or between the frequency generator which generates the local oscillator signal and that down-conversion frequency mixer which brings about the conversion from intermediate-frequency level to baseband.

When the device for interchanging the in-phase and quadrature connections is connected between the two down-conversion frequency mixers, a further device for interchanging the in-phase and quadrature paths is advantageously connected to the output of the down-conversion frequency mixer that converts from intermediate frequency to baseband. This has the advantage that there is again compensation for an arithmetic sign caused as a result of interchanging the components of the useful signal.

Connected to the output side of the down-conversion frequency mixer provided in the general form of the invention is preferably a demodulator which demodulates the signal down-converted from intermediate-frequency level to baseband. This demodulator is preferably in the form of a quadricorrelator or in the form of a delay demodulator, depending on whether the rest of the signal processing takes place in analog or digital form.

BRIEF DESCRIPTION OF THE DRAWINGS

The invention is explained in more detail below using a plurality of exemplary embodiments with reference to the figures, in which:

FIG. 2 shows a further exemplary embodiment of the present invention using a simplified block diagram.

DETAILED DESCRIPTION OF THE INVENTION

Figure 1:
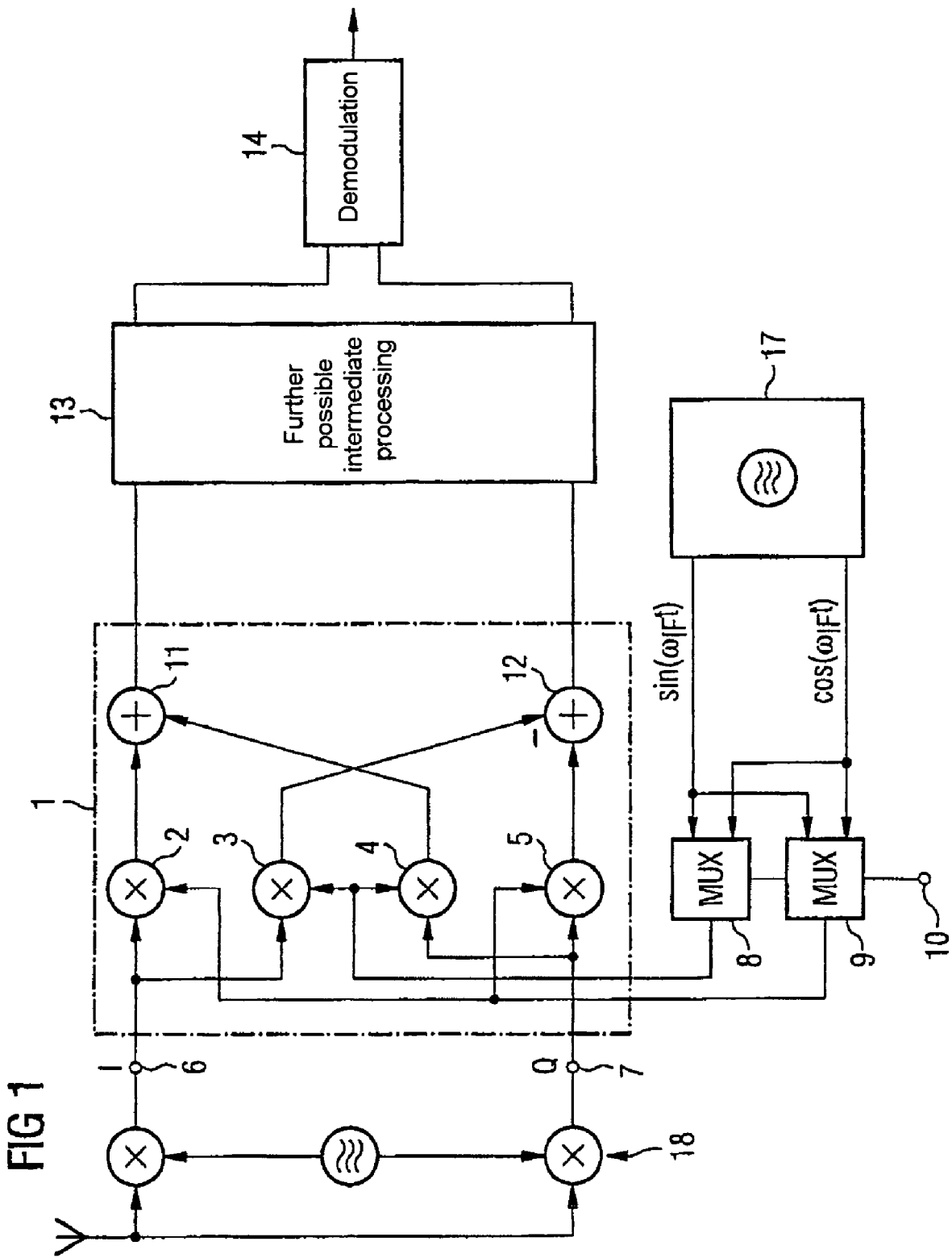
FIG. 1 shows a first exemplary embodiment of the invention using a simplified block diagram.

FIG. 1 shows a receiver arrangement with a down-conversion frequency mixer 1 which is designed to down-convert a useful signal, which is available as a complex-value signal, from an intermediate-frequency level to baseband. In this case, the complex-value signal is a signal that is split into an in-phase component and a quadrature component that is orthogonal thereto. Such frequency mixers 1 designed for complex-value signal processing are also called IQ mixers. The present down-conversion frequency mixer 1 comprises four mixer cells 2 to 5 which each have two inputs and one output, and which each provides a multiplied signal. The first input of the first mixer cell 2 is connected to the in-phase input 6 of the frequency mixer 1, as is the first input of the second mixer cell 3. The first inputs of the third and fourth mixer cells 4, 5 are connected to the quadrature input 7 of the down-conversion frequency mixer 1.

The second inputs of the mixer cells 2 to 5 are supplied with a local oscillator signal at the carrier frequency of the useful signal I, Q applied to the inputs 6, 7. In this case, however, there is a device for interchanging the in-phase and quadrature components of the local oscillator signal 8, 9 (e.g., first and second phases of the local oscillator signal), said device being connected between a frequency generator 17 and the second inputs of the mixer 1. This device 8, 9 comprises a first multiplexer 8 and a second multiplexer 9. The multiplexers 8, 9 each have two inputs and one output and also a control input 10 for supplying a changeover command. The output of the multiplexer 8 is connected to the second inputs of the mixer cells 3, 4. The output of the second multiplexer 9 is connected to the second inputs of the first and fourth mixer cells 2, 5. The first and second inputs of the two multiplexers 8, 9 are respectively connected to one another in order to form a local oscillator input for supplying a local oscillator signal containing signal components which are at 90° to one another (e.g., the first and second phases of the local oscillator signal).

Connected to the 0°/90° local oscillator input formed in this manner is a frequency generator 17, designed as a phase locked loop with signal conditioning. The down-conversion frequency mixer 1 comprises not only the mixer cells 2 to 5 but also two summing nodes 11, 12 which each have two inputs and one output. The inputs of the summing node 11 are connected to the outputs of the mixer cells 2 and 4, the output of the mixer cell 4 being connected in a non-inverting fashion. The outputs of the mixer cells 3, 5 are connected to the inputs of the summing node 12, with the output of the mixer cell 3 being connected thereto in an inverting fashion. The outputs of the summing nodes 11, 12 form the IQ outputs of the down-conversion frequency mixer 1 and are connected to a further signal processing stage 13, whose output in turn has a demodulator 14 connected to it. Up to the demodulator 14, the signal to be demodulated is supplied as a complex-value signal.

The IQ input 6, 7 has a further down-conversion frequency mixer stage 18 connected to it that converts a radio-frequency signal received by an antenna to an intermediate-frequency level. On the intermediate-frequency level, further signal conditioning means, such as amplifiers and filters, are also provided between the mixing stage 18 and the mixing stage 1, but these are not shown in the present case since they are not required in order to understand the present invention.

Depending on which sideband of the useful signal has been modulated, the present invention allows the local oscillator frequency to be left unchanged by interchanging the in-phase and quadrature components of the local oscillator signal, and still allows down-conversion of the channel which is above the local oscillator frequency, on the one hand, and of the channel which is below the local oscillator frequency, on the other. This will be explained below with reference to a mathematical, exemplary description using a complex-value signal $s(t)=I(t)+jQ(t)$:

$$s_{LO}=\exp(-j\omega_{IF}t),$$

$$s_{+IF}=\exp(j[\omega_{IF}t+\phi(t)]),$$

$$s_{-IF}=\exp(j[-\omega_{IF}t+\phi(t)]),$$

$$s_{+IF}*s_{LO}=\exp(j\omega_{IF}t+\phi(t)-\omega_{IF}t])=\exp(j\phi(t)),$$

$$s_{-IF}*s_{LO,I<->Q}=j*\exp(j[-\omega_{IF}t+\phi(t)]+j\omega_{IF}t])=j*\exp(j\phi(t)).$$

where $s_{LO}$ is the local oscillator signal, $s_{LO,I<->Q}$ is the local oscillator signal with interchanged quadrature components, $s_{+IF}$ and $s_{-IF}$ are the IF signals with modulated upper and lower sidebands, and $\omega_{IF}$ is the angular frequency of the intermediate-frequency signal.

It is thus advantageously possible to dispense with a duplicate design for analog and digital components for the cases where the upper or lower sideband has been modulated. As a further advantage, it is possible to use a phase locked loop as a frequency generator 17, wherein the phase locked loop does not need to change its frequency between send and receive time slots if the nominal channel remains the same.

As already mentioned, the multiplexing which brings about interchange of in-phase and quadrature components may alternatively also be provided in the useful signal instead of the LO signal. An exemplary embodiment of this type is shown in FIG. 2.

FIG. 2 shows a block diagram of an alternative embodiment of the invention using an exemplary block diagram whose components used, advantageous interconnection and manner of operation largely correspond to those in FIG. 1. In this respect, the description is not repeated at this juncture. The only difference is that the arrangement of the multiplexers 8, 9 in the illustration shown in FIG. 2 is not provided in the supply of the local oscillator signal and accordingly upstream of the second inputs of the mixer cells 2 to 5, but rather at the first inputs of the mixer cells 2 to 5 and accordingly in the useful-signal path. In addition, to compensate for any negative arithmetic sign occurring in the useful signal, a further device for interchanging the in-phase and quadrature connections is provided which has the reference symbols 15, 16 and is connected in the I and Q paths between the processing unit 16 and the demodulator 14.

Specifically, the in-phase input 6 of the down-conversion mixing stage is connected to the first input of the first multiplexer 8 and to the second input of the second multiplexer 9. The quadrature input 7 is connected to the second input of the first multiplexer 8 and to the first input of the second multiplexer 9. The control inputs of the two multiplexers 8, 9 are in turn connected to one another and to a changeover input 10 for the purpose of changing over between a first and a second switching state for the changeover device 8, 9. The output of the multiplexer 8 is connected to the first inputs of the first and second mixer cells 2, 3, while the output of the second multiplexer 9 is connected to the first inputs of the third and fourth mixer cells 4, 5.

A component of the local oscillator signal is supplied to the second inputs of the first and fourth mixer cells 2, 5, while the other component, which is orthogonal thereto, of the complex-value local oscillator signal is supplied to the second and third mixer cells 3, 4. For this purpose, the second inputs of the mixer cells 2 to 5 are connected to the 0-degree/90-degree output of the frequency generator 17. The design of the down-conversion frequency mixer 1 is unchanged from the diagram shown in FIG. 1. The rest of the device for interchanging the in-phase and quadrature connections comprises two multiplexers 15, 16, each with two inputs and one output. Like the multiplexers 8, 9 in FIG. 2, these are connected such that, depending on the control signal, the in-phase and quadrature components at the output of the intermediate-processing stage 13 are supplied to the demodulator 14 either unchanged or interchanged.

This allows the modulation signal to be processed with the correct arithmetic sign by interchanging the I and Q paths again.

The way in which the circuit shown in FIG. 2 works is likewise explained using a mathematical description in a similar manner to the example from FIG. 1:

$$s_{-IF,I<->Q}*s_{LO}=j*\exp(-j[-\omega_{IF}t+\phi(t)]-j\omega_{IF}t)=j*\exp(-j\phi(t)),$$

where $s_{-IF,I<->Q}$ represents the useful signal with interchanged quadrature components.

It will be seen that, as in the case of FIG. 1, the signals that can be tapped off at the output of the circuit have a phase shift of 90° with respect to the wanted signal, but this has no disadvantageous influence on the rest of the signal processing.

The advantages of the circuit in FIG. 2 correspond to those of the exemplary embodiment in FIG. 1 and are therefore not presented again at this juncture.

It is naturally within the scope of the invention for other circuit means to be used as well in order to achieve the inventive principle's underlying interchange of the in-phase and quadrature components on the basis of a control signal.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A mobile radio receiver, comprising:
    a down-conversion frequency mixer configured to multiply complex-value signals, the mixer comprising a first input comprising an in-phase connection and a quadrature connection, a second input comprising a first phase local oscillator connection and a second phase local oscillator connection, and an output comprising an in-phase output connection and a quadrature output connection; and
    a switching device configured to switch the in-phase and quadrature connections of the first mixer input or the first and second phase local oscillator connections of the second mixer input on the basis of a control signal, wherein the control signal causes the switching device to switch based upon whether a received useful signal at the down-conversion frequency mixer is in an upper or lower reception sideband.

2. The receiver of claim 1, wherein the switching device comprises a circuit coupled to the first input or to the second input of the down-conversion frequency mixer, the circuit comprising an in-phase input and a quadrature input, and an in-phase output and a quadrature output, and configured to coupled, in a first switching state, the in-phase input thereof to the in-phase output thereof and the quadrature input thereof to the quadrature output thereof, and to couple, in a second switching state, the in-phase input thereof to the quadrature output thereof and the quadrature input thereof to the in-phase output thereof.

3. The receiver of claim 1, wherein the switching device comprises a first multiplexer comprising two inputs configured to receive first and second phase local oscillator signals and an output connected to the first phase local oscillator connection, and a second multiplexer comprising two inputs configured to receive the first and second local oscillator signals and an output connected to the second phase local oscillator connection of the down-conversion frequency mixer.

4. The receiver of claim 3, wherein the first multiplexer and the second multiplexer each have a control input for switching between first and second switching states to selectively pass one of the first and second phase local oscillator signals to the first and second local oscillator connections of the mixer, respectively, the two control inputs being connected to one another in order to receive the control signal.

5. The receiver of claim 1, further comprising
    a frequency generator configured to generate a local oscillator signal, wherein the frequency generator includes an output comprising a first phase connection and a second phase connection which are selectively coupled to the second input of the down-conversion frequency mixer through the switching device.

6. The receiver of claim 5, wherein the switching device is connected between the output of the frequency generator and the second input of the down-conversion frequency mixer.

7. The receiver of claim 1, wherein the receiver comprises a heterodyne receiver, the receiver further comprising an upstream down-conversion frequency mixer comprising an output coupled to the first input of the down-conversion frequency mixer.

8. The receiver of claim 7, wherein the switching device is connected between the output of the upstream down-conversion frequency mixer and the first input of the down-conversion frequency mixer.

9. The receiver of claim 8, further comprising a second switching device configured to switch the in-phase and quadrature output connections of the down-conversion frequency mixer.

10. The receiver of claim 1, further comprising a quadricorrelator demodulator coupled to the in-phase and quadrature output connections of the down-conversion frequency mixer.

11. A mobile radio receiver, comprising:
    a mixer comprising an in-phase input and a quadrature input, a first phase local oscillator input and a second phase local oscillator input, and an in-phase output and a quadrature output, wherein the mixer is configured to down-convert a low intermediate frequency signal to baseband;
    a local oscillator frequency generator configured to generate local oscillator frequency signals having a first phase and a second phase, respectively; and
    a switching circuit configured to selectively switch the low intermediate frequency signal at the in-phase input and the quadrature input of the mixer or selectively switch the first and second phase local oscillator frequency signals at the first and second local oscillator inputs of the mixer on the basis of a control signal, wherein the control signal causes the switching device to switch based upon whether a received useful signal at the down-conversion frequency mixer is in an upper or lower reception sideband.

12. The mobile receiver of claim 11, wherein the switching circuit comprises:
    a first multiplexer comprising first and second inputs coupled to the first and second phase local oscillator frequency signals, respectively, and an output coupled to the first phase local oscillator input of the mixer, wherein the first multiplexer is configured to selectively pass one of the first and second phase local oscillator frequency signals based on a state of a control signal coupled thereto; and
    a second multiplexer comprising first and second inputs coupled to the first and second phase local oscillator frequency signals, respectively, and an output coupled to the second phase local oscillator input of the mixer, wherein the second multiplexer is configured to selectively pass the other of the first and second phase local oscillator frequency signals to the output thereof based on the state of the control signal coupled thereto.

13. The mobile receiver of claim 12, wherein mixer comprises:
   a first mixer cell comprising a first input coupled to the in-phase input of the mixer, a second input coupled the output of the second multiplexer, and an output;
   a second mixer cell comprising a first input coupled to the in-phase input of the mixer, a second input coupled to the output of the first multiplexer, and an output;
   a third mixer cell comprising a first input coupled to the quadrature input of the mixer, a second input coupled to the output of the first multiplexer, and an output;
   a fourth mixer cell comprising a first input coupled to the quadrature input of the mixer, a second input coupled to the output of the second multiplexer, and an output;
   a first summing circuit configured to sum the outputs of the first and third mixer cells, and output a summed signal to the in-phase output of the mixer; and
   a second summing circuit configured to sum the output of the fourth mixer cell and an inverted output of the second mixer cell, and output a summed signal to the quadrature output of the mixer.

14. The mobile receiver of claim 11, wherein the switching circuit comprises:
   a first multiplexer comprising first and second inputs configured to receive in-phase and quadrature input signals, respectively, and an output coupled to the in-phase input of the mixer, wherein the first multiplexer is configured to selectively pass one of the in-phase and quadrature input signals to the output thereof to couple to the in-phase input of the mixer based on a state of a control signal coupled thereto; and
   a second multiplexer comprising first and second inputs configured to receive the in-phase and quadrature input signals, respectively, and an output coupled to the quadrature input of the mixer, wherein the second multiplexer is configured to selectively pass the other of the in-phase and quadrature inputs signals to the output thereof to coupled to the quadrature input of the mixer based on the state of the control signal coupled thereto.

15. The mobile receiver of claim 14, wherein mixer comprises:
   a first mixer cell comprising a first input coupled to the output of the first multiplexer, a second input coupled the second phase local oscillator signal, and an output;
   a second mixer cell comprising a first input coupled to the output of the first multiplexer, a second input coupled to the first phase local oscillator signal, and an output;
   a third mixer cell comprising a first input coupled to the output of the second multiplexer, a second input coupled to the first phase local oscillator signal, and an output;
   a fourth mixer cell comprising a first input coupled to the output of the second multiplexer, a second input coupled to the second phase local oscillator signal, and an output;
   a first summing circuit configured to sum the outputs of the first and third mixer cells, and output a summed signal to the in-phase output of the mixer; and
   a second summing circuit configured to sum the output of the fourth mixer cell and an inverted output of the second mixer cell, and output a summed signal to the quadrature output of the mixer.

16. The mobile receiver of claim 15, further comprising a phase changing circuit coupled to the in-phase and quadrature outputs of the mixer, and configured to selectively switch the in-phase and quadrature outputs of the mixer.

17. The mobile receiver of claim 16, further comprising a demodulator coupled to the output of the phase changing circuit.

* * * * *